(12) United States Patent
Satoh

(10) Patent No.: US 11,489,066 B2
(45) Date of Patent: Nov. 1, 2022

(54) SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/315,724

(22) Filed: May 10, 2021

(65) Prior Publication Data
US 2022/0149189 A1 May 12, 2022

(30) Foreign Application Priority Data

Nov. 6, 2020 (JP) .............................. JP2020-186056

(51) Int. Cl.
*H01L 29/739* (2006.01)
*H01L 29/423* (2006.01)
*H01L 29/16* (2006.01)
*H01L 29/20* (2006.01)
*H02P 27/06* (2006.01)

(52) U.S. Cl.
CPC ...... *H01L 29/7397* (2013.01); *H01L 29/4238* (2013.01); *H01L 29/1602* (2013.01); *H01L 29/1608* (2013.01); *H01L 29/2003* (2013.01); *H02P 27/06* (2013.01)

(58) Field of Classification Search
CPC ............. H01L 29/7393; H01L 29/4238; H01L 29/1602; H01L 29/1608; H01L 29/2003; H02P 27/06

USPC ......................................................... 257/139
See application file for complete search history.

(56) References Cited

U.S. PATENT DOCUMENTS

| | | | |
|---|---|---|---|
| 4,980,743 A | 12/1990 | Nakagawa et al. | |
| 2015/0162429 A1* | 6/2015 | Hashimoto | H02M 7/003 257/288 |
| 2016/0343838 A1* | 11/2016 | Hashimoto | H02M 7/003 |
| 2020/0098903 A1* | 3/2020 | Satoh | H01L 29/7397 |
| 2020/0112307 A1* | 4/2020 | Satoh | H02M 7/1623 |

FOREIGN PATENT DOCUMENTS

| | | |
|---|---|---|
| JP | S64-57674 A | 3/1989 |
| JP | 2010251517 A * | 11/2010 |
| WO | 2015/114787 A1 | 8/2015 |

* cited by examiner

*Primary Examiner* — Igwe U Anya
(74) *Attorney, Agent, or Firm* — Studebaker & Brackett PC

(57) ABSTRACT

The plurality of first control electrodes extend in a first direction in a planar view, the plurality of second control electrodes extend in a second direction in a planar view. A sum of lengths in the first direction of boundaries between the second semiconductor layer and the plurality of third semiconductor layers on a surface of the semiconductor substrate which faces the plurality of first control electrodes is set as a first gate total width. A sum of lengths in the second direction of boundaries between the fourth semiconductor layer and the plurality of fifth semiconductor layers on a surface of the semiconductor substrate which faces the plurality of second control electrodes is set as a second gate total width. A gate width ratio obtained by dividing the second gate total width by the first gate total width is equal to or higher than 1.0.

7 Claims, 9 Drawing Sheets

SEMICONDUCTOR DEVICE

BACKGROUND OF THE INVENTION

Field

The present disclosure relates to a semiconductor device.

Background

In the IGBT, an emitter electrode (cathode) is provided on a surface, and a collector electrode (anode) is provided on a back side. An IGBT having a double gate structure in which a first gate electrode is provided on a surface and a second gate electrode is provided on a back side has been proposed (see, for example, (see, for example, Japanese Patent Laid-Open No. H01-057674).

At turn-off, a signal is applied to the second gate electrode to form a channel which connects an N base layer and an N collector layer near the second gate electrode. Further, a P base layer and the N base layer function as a PN diode. By this means, a current path from an emitter electrode including an emitter electrode, the P base layer, the N base layer, a back side channel region, the N collector layer and a collector electrode to the collector electrode is formed. Excess electrons accumulated in the N base layer are discharged through this path, so that it is possible to considerably reduce a turn-off switching loss without sacrificing an ON voltage.

If a parasitic diode built in this IGBT having the double gate structure can be equipped with a sufficient energization function, the parasitic diode functions in a similar manner to a free wheeling diode connected to the IGBT in inverse parallel. Consequently, it is possible to make capacity of the free wheeling diode smaller or eliminate the free wheeling diode.

SUMMARY

However, the IGBT having the double gate structure in related art has focused on reduction in a turn-off loss of the IGBT and has not focused on full use of functions of the parasitic diode. Thus, energization capability of the parasitic diode is not high. Further, it is necessary to make the N base layer thicker as a withstand voltage becomes higher. For example, thicknesses of N base layers of an IGBT on the order of 1000 V, an IGBT on the order of 3000 V and an IGBT on the order of 6000 V are respectively set at approximately 120 micrometers, approximately 350 micrometers, and approximately 650 micrometers. Consequently, a current path becomes longer as the withstand voltage becomes higher, and thus, the diode has less energization performance. It has been therefore impossible to make capacity of the free wheeling diode connected to the IGBT in inverse parallel smaller or eliminate the free wheeling diode.

The present disclosure has been made to solve the problems as described above and is directed to providing a semiconductor device which is capable of improving energization performance of a parasitic diode.

A semiconductor device according to the present disclosure includes: a semiconductor substrate having first and second main surface which face each other; a first semiconductor layer of a first conductive type provided between the first main surface and the second main surface of the semiconductor substrate; a second semiconductor layer of a second conductive type provided between the first semiconductor layer and the first main surface; a plurality of third semiconductor layers of a first conductive type selectively provided on a surface of the second semiconductor layer; a fourth semiconductor layer of a second conductive type provided between the first semiconductor layer and the second main surface; a plurality of fifth semiconductor layers of a first conductive type selectively provided on a surface of the fourth semiconductor layer; a first main electrode provided on the first main surface and connected to the second and third semiconductor layers; a second main electrode provided on the second main surface and connected to the fourth and fifth semiconductor layers; a plurality of first control electrodes respectively switching conductive states and non-conductive states between the first semiconductor layer and the plurality of third semiconductor layers in accordance with electrical signals; and a plurality of second control electrodes respectively switching conductive states and non-conductive states between the first semiconductor layer and the plurality of fifth semiconductor layers in accordance with electrical signals, wherein the plurality of first control electrodes have stripe shapes extending in a first direction in a planar view, the plurality of second control electrodes have stripe shapes extending in a second direction in a planar view, a sum of lengths in the first direction of boundaries between the second semiconductor layer and the plurality of third semiconductor layers on a surface of the semiconductor substrate which faces the plurality of first control electrodes is set as a first gate total width, a sum of lengths in the second direction of boundaries between the fourth semiconductor layer and the plurality of fifth semiconductor layers on a surface of the semiconductor substrate which faces the plurality of second control electrodes is set as a second gate total width, and a gate width ratio obtained by dividing the second gate total width by the first gate total width is equal to or higher than 1.0.

In the present disclosure, the plurality of first control electrodes extend in a first direction in a planar view, the plurality of second control electrodes extend in a second direction in a planar view. A sum of lengths in the first direction of boundaries between the second semiconductor layer and the plurality of third semiconductor layers on a surface of the semiconductor substrate which faces the plurality of first control electrodes is set as a first gate total width. A sum of lengths in the second direction of boundaries between the fourth semiconductor layer and the plurality of fifth semiconductor layers on a surface of the semiconductor substrate which faces the plurality of second control electrodes is set as a second gate total width. A gate width ratio obtained by dividing the second gate total width by the first gate total width is equal to or higher than 1.0. It is therefore possible to improve energization performance of the parasitic diode.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
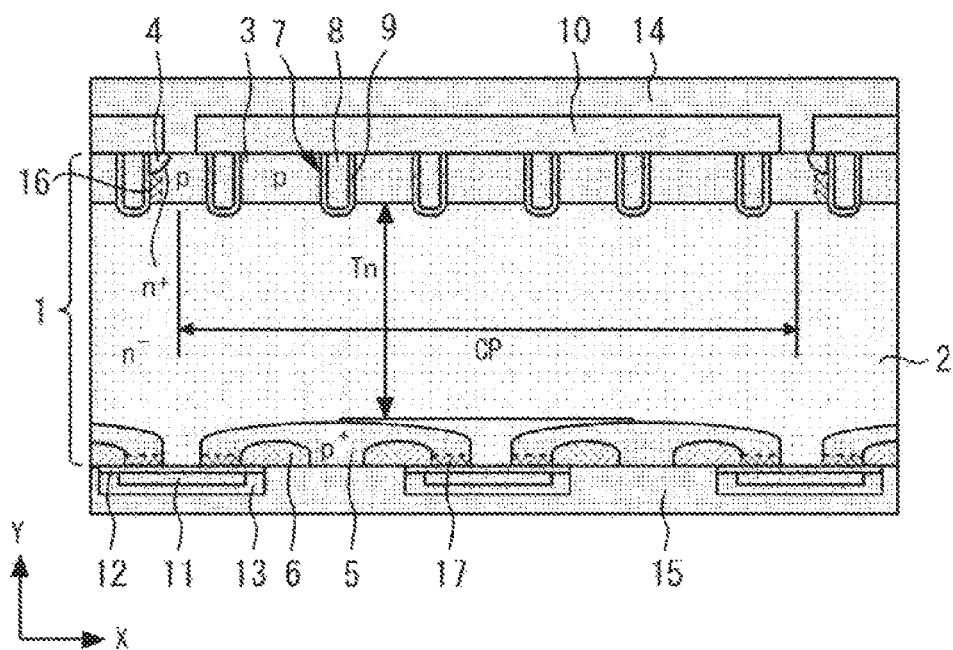
FIG. 1 is a cross-sectional view illustrating a semiconductor device according to a first embodiment.

FIG. 1 is a cross-sectional view illustrating a semiconductor device according to a first embodiment. This semiconductor device is an IGBT having a double gate structure in which a front side has a trench gate structure and a back side has a planar gate structure. In FIG. 1, a lateral direction is set as an X direction and a vertical direction is set as a Y direction to make positional relationship among respective components clear.

A semiconductor substrate 1 has a surface and a back side which face each other. An N base layer 2 is provided between the front surface and the back side of the semiconductor substrate 1. A P base layer 3 is provided between the N base layer 2 and the surface of the semiconductor substrate 1. A plurality of N emitter layers 4 are selectively provided on a surface of the P base layer 3. A plurality of P collector layers 5 are provided between the N base layer 2 and the back side of the semiconductor substrate 1. A plurality of N collector layers 6 are selectively provided on surfaces of the P collector layers 5.

A plurality of trenches 7 are formed on the front side of the semiconductor substrate 1 so as to pass through the N emitter layers 4 and the P base layer 3 and reach the N base layer 2. Front side gate electrodes 8 are formed inside a plurality of trenches 7 via front side gate insulating films 9. Front side interlayer films 10 cover the front side gate electrodes 8. Back side gate electrodes 11 are formed on the back side of the semiconductor substrate 1 via back side gate insulating films 12 so as to face the N base layer 2, the P collector layers 5 and the N collector layers 6. Back side interlayer films 13 cover the back side gate electrodes 11.

An emitter electrode 14 is provided on the surface of the semiconductor substrate 1 and is connected to the P base layer 3 and the N emitter layers 4. A collector electrode 15 is provided on the back side of the semiconductor substrate 1 and is connected to the P collector layers 5 and the N collector layers 6.

A region on the front side of the semiconductor substrate 1 is divided into a plurality of mesa portions by the trenches 7 of the plurality of front side gate electrodes 8. The plurality of mesa portions include cell portions including the N emitter layers 4 connected to the emitter electrode 14 and dummy cell portions which do not include the N emitter layers 4 connected to the emitter electrode 14 or which do not include the N emitter layers 4. The cell portions and the dummy cell portions form an emitter side IGBT region. An interval between adjacent cell portions is referred to as a cell pitch CP. A shortest distance from the P base layer 3 to the P collector layers 5, that is, a thickness Tn of the N base layer 2 determines withstand voltage performance.

If electrical signals are applied to the front side gate electrodes 8, front side gate channels 16 are formed in regions of the P base layer 3 which face the front side gate electrodes 8 via the front side gate insulating films 9. The N emitter layers 4 are electrically conducted to the N base layer 2 through the front side gate channels 16. Thus, the plurality of front side gate electrodes 8 respectively switch conductive states and non-conductive states between the N base layer 2 and the plurality of N emitter layers 4 in accordance with electrical signals.

If electrical signals are applied to the back side gate electrodes 11, back side gate channels 17 are formed in regions of the P collector layers 5 which face the back side gate electrodes 11 via the back side gate insulating films 12. The N collector layers 6 are electrically conducted to the N base layer 2 through the back side gate channels 17. Thus, the back side gate electrodes 11 respectively switch conductive states and non-conductive states between the N base layer 2 and the plurality of N collector layers 6 in accordance with electrical signals.

Figure 2:
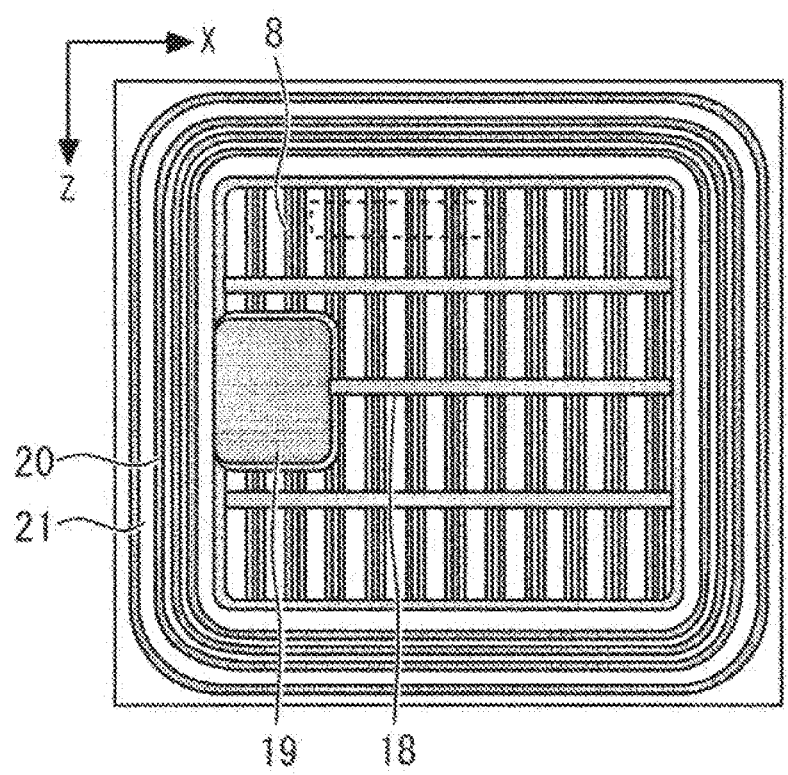
FIG. 2 is a plan view of the semiconductor device according to the first embodiment viewed from the emitter side.

FIG. 2 is a plan view of the semiconductor device according to the first embodiment viewed from the emitter side. FIG. 2 illustrates a direction in which the front side gate electrodes 8 extend as a Z direction. The plurality of front side gate electrodes 8 have stripe shapes extending in the Z direction in a planar view perpendicular to the surface of the semiconductor substrate 1 and are arranged in parallel to each other. A front side gate wiring 18 is connected to the front side gate electrodes 8. The front side gate wiring 18 is connected to a front side gate electrode pad 19. An outer peripheral region including an outer peripheral electrode 20 and an N+ layer 21 to keep withstand voltage characteristics is provided on an outer periphery of the emitter side IGBT region. The outer peripheral region is covered with an outer peripheral protective film.

Figure 3:
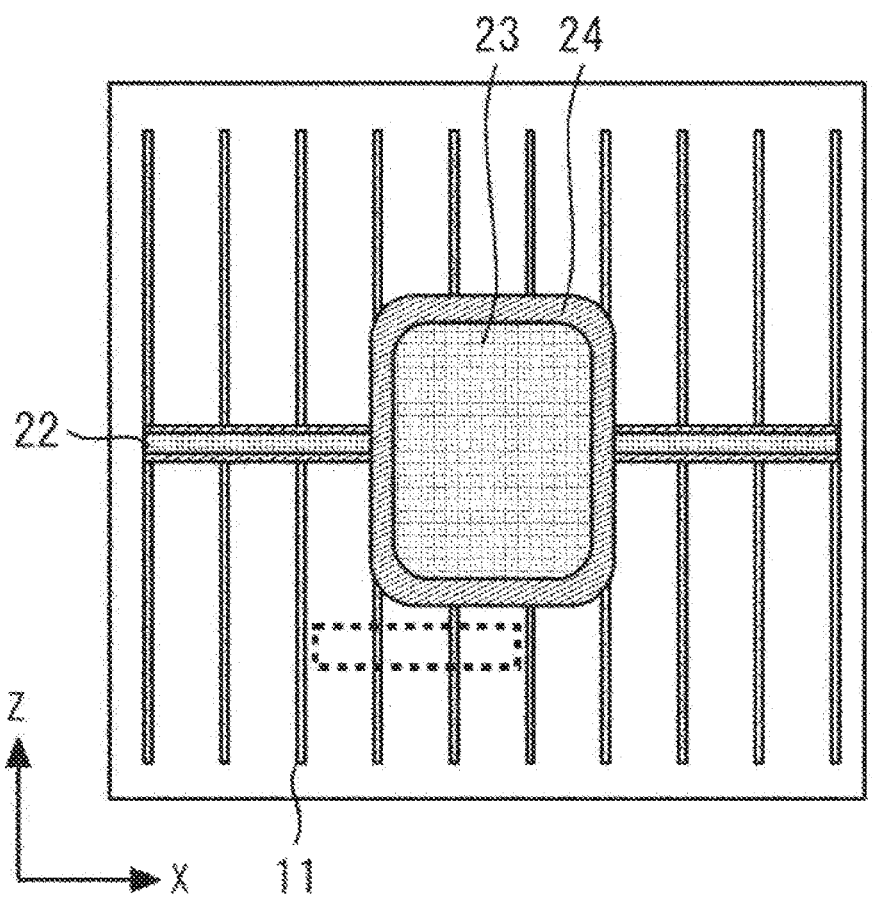
FIG. 3 is a plan view of the semiconductor device according to the first embodiment viewed from the collector side.

FIG. 3 is a plan view of the semiconductor device according to the first embodiment viewed from the collector side. The plurality of back side gate electrodes 11 have stripe shapes extending in the Z direction in a planar view perpendicular to the back side of the semiconductor substrate 1 and are arranged in parallel to each other. A back side gate wiring 22 is connected to the back side gate electrodes 11. The back side gate wiring 22 is connected to a back side gate electrode pad 23. Parts of the back side gate wiring 22 and the back side gate electrode pad 23 are coated with a protective film 24.

The front side gate insulating films 9 and the back side gate insulating films 12 are normally constituted with an oxide film such as $SiO_2$. The front side gate electrodes 8 and the back side gate electrodes 11 are constituted with polysilicon doped with N type impurities. The front side interlayer films 10 and the back side interlayer films 13 are constituted with silicate glass (BPSG) containing boron and phosphorus. The emitter electrode 14, the collector electrode 15, the front side gate wiring 18, the front side gate electrode pad 19, the back side gate wiring 22 and the back side gate electrode pad 23 are constituted with aluminum containing silicon.

Figure 4:
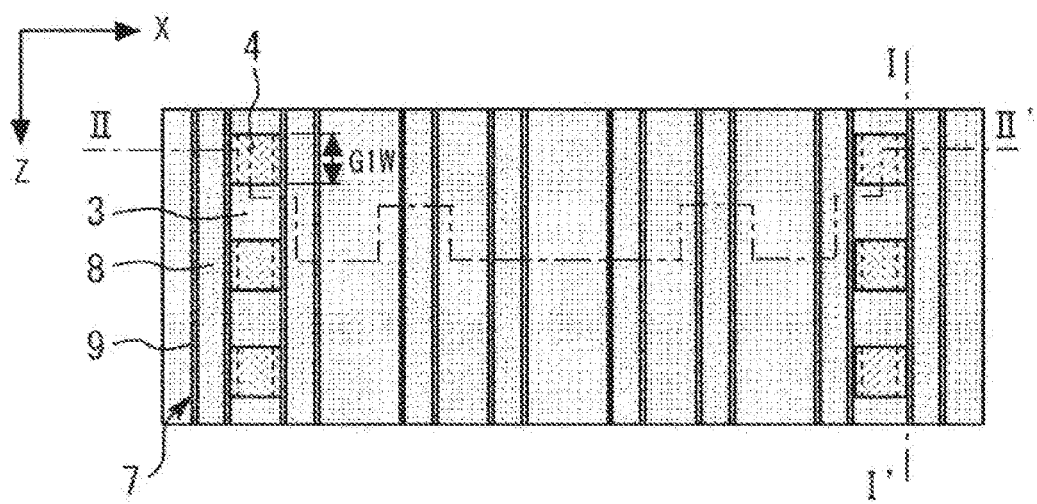
FIG. 4 is an enlarged plan view of a region enclosed with a dashed line in FIG. 2.
Figure 5:
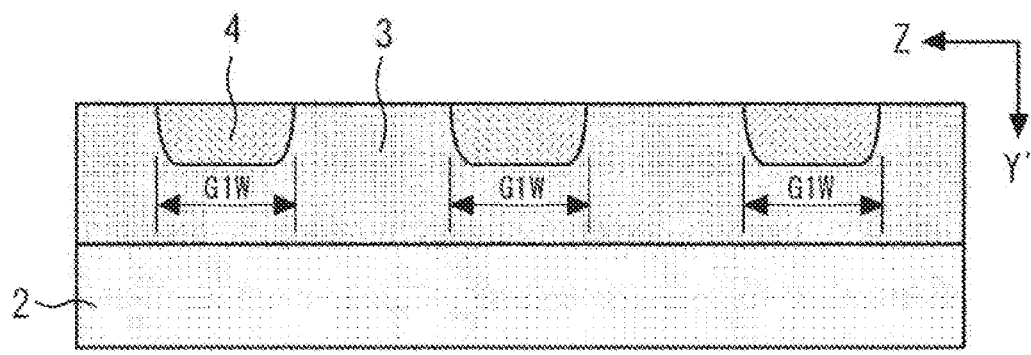
FIG. 5 is a cross-sectional view of a portion around the emitter layer along I-I' in FIG. 4.

FIG. 4 is an enlarged plan view of a region enclosed with a dashed line in FIG. 2. FIG. 5 is a cross-sectional view of a portion around the emitter layer along I-I' in FIG. 4. The emitter electrode 14 and the front side interlayer films 10 are omitted. A length G1W in the Z direction of a boundary between the P base layer 3 and the N emitter layer 4 on the surface (Y-Z plane) of the semiconductor substrate 1 which faces the front side gate electrode 8 is a width of the front side gate channel 16. A sum of lengths G1W at the plurality of N emitter layers 4 is set as a first gate total width ΣG1W.

Figure 6:
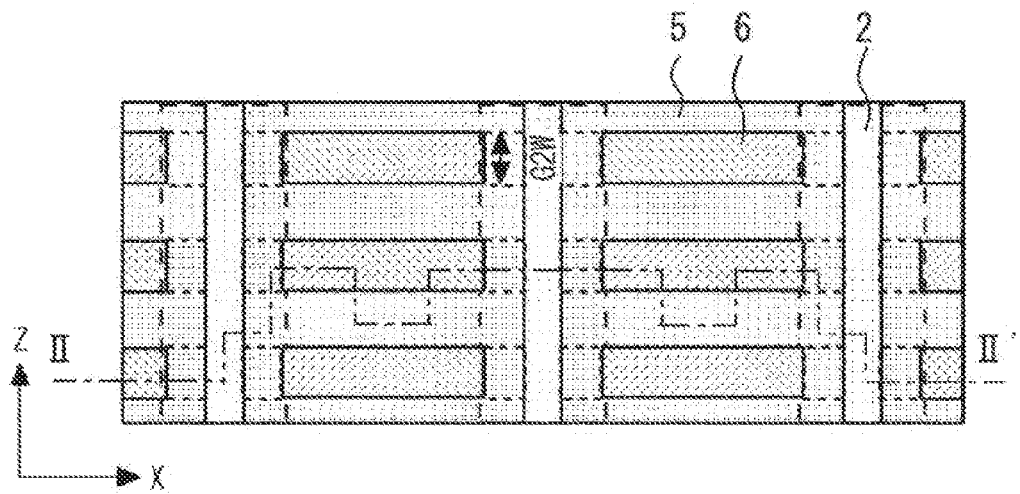
FIG. 6 is an enlarged plan view of a region enclosed with a dashed line in FIG. 3.
Figure 7:
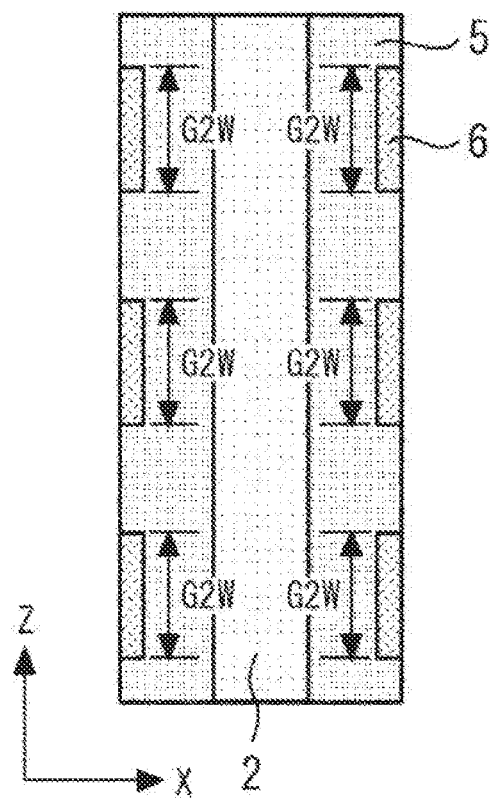
FIG. 7 is an enlarged plan view of a region enclosed with a dashed line in FIG. 6.

FIG. 6 is an enlarged plan view of a region enclosed with a dashed line in FIG. 3. FIG. 7 is an enlarged plan view of a region enclosed with a dashed line in FIG. 6. FIG. 1 corresponds to a cross-sectional view along II-II' in FIG. 4 and FIG. 6. The back side gate electrodes 11, the back side gate insulating films 12, the back side interlayer films 13 and the collector electrode 15 are omitted. A length G2W in the Z direction of a boundary between the P collector layer 5 and the N collector layer 6 on the front surface (X-Z plane) of the semiconductor substrate 1 which faces the back side gate electrode 11 is a width of the back side gate channel 17. A sum of lengths G2W at the plurality of N collector layers 6 is set as a second gate total width ΣG2W.

In the present embodiment, the semiconductor device is designed so that a gate width ratio (ΣG2W/ΣG1W) obtained by dividing the second gate total width ΣG2W by the first gate total width ΣG1W becomes equal to or higher than 1.0. Note that an upper limit of the gate width ratio (ΣG2W/ΣG1W) is approximately 10.

A rated withstand voltage of a front side gate and a back side gate is ±7 V in a similar manner to a rated withstand voltage of gates of a scaling IGBT whose scaling factor (k) is 3. A threshold voltage of the front side gate and the back side gate is approximately +1.7 V in a similar manner to a threshold voltage of the scaling IGBT. A gate voltage to be applied to the front side gate and the back side gate to cause a gate channel to stably operate by lowering resistance is +5 V which is approximately triple of the threshold voltage in a similar manner to a gate voltage of the scaling IGBT.

Table 1 indicates an aspect of voltage block and current energization of operation of such an IGBT having the double gate structure. A positive or negative collector voltage is applied with respect to a ground potential of the emitter electrode 14. A gate voltage which is positive with respect to the ground potential of the emitter electrode 14 is applied to the front side gate electrodes 8. A gate voltage which is positive with respect to a potential of the collector electrode 15 is applied to the back side gate electrodes 11. The aspect of the operation is one of voltage block, forward current energization and reverse current energization and includes neither an aspect of a leakage current nor an aspect of breakdown of junction. In voltage block, a current does not flow from the collector electrode 15 to the emitter electrode 14. In forward current energization, a current flows from the collector electrode 15 to the emitter electrode 14. In reverse current energization, a current flows from the emitter electrode 14 to the collector electrode 15.

TABLE 1

| operation mode | collector voltage | front side gate voltage | back side gate voltage | aspect of operation |
|---|---|---|---|---|
| 1 | positive | not applied | not applied | voltage block |
| 2 | positive | applied | not applied | forward current energization |
| 3 | positive | applied | applied | forward current energization (large resistance when energized) |
| 4 | positive | not applied | applied | voltage block |
| 5 | negative | not applied | not applied | voltage block |
| 6 | negative | applied | not applied | voltage block |
| 7 | negative | applied | applied | reverse current energization (large resistance when energized) |
| 8 | negative | not applied | applied | reverse current energization |

Subsequently, switching operation will be described. First, an ON state (operation mode 2 in Table 1) where a large current flows from the collector electrode 15 to the emitter electrode 14 with a low collector voltage $V_{CE}$ will be described. A predetermined collector voltage $V_{CE}$ is applied between the emitter electrode 14 and the collector electrode 15. A gate voltage is not applied between the collector electrode 15 and the back side gate electrodes 11 or a voltage (reverse bias) which is negative with respect to the collector electrode 15 is applied to the back side gate electrodes 11. A voltage $V_{G1E}$ (forward bias) which is positive with respect to the emitter electrode 14 is applied to the front side gate electrodes 8. In this case, the first front side gate channels 16 are formed as a result of regions near the front side gate electrodes 8 in the P base layer 3 being inverted to an N type. A current path is formed in the N emitter layer 4, the front side gate channels 16 and the N base layer 2. Electrons having negative charges are injected from the emitter electrode 14 to the N base layer 2 through this path. The injected electrodes negatively charge the N base layer 2 and forwardly bias PN junction of the P collector layer 5 and the N base layer 2. By this means, holes having positive charges are injected to the N base layer 2 from the collector electrode 15 through the P collector layer 5. This results in increase in density of the holes existing in the N base layer 2, causes conductivity modulation and drastically reduces resistance components of the N base layer 2. Consequently, a large collector current flows from the collector electrode 15 to the emitter electrode 14 even with a low collector voltage $V_{CE}$. Voltage drop between the collector and the emitter of the IGBT having the double gate structure at this time is an ON voltage $V_{CEsat}$.

Turn-off switching operation in which a state of the IGBT having the double gate structure transitions from an ON state to an OFF state will be described next. A zero potential or a negative potential is applied to the front side gate electrodes 8, and application of a positive voltage to the emitter electrode 14 is stopped. As a result, the regions near the front side gate electrodes 8 in the P base layer 3, which are inverted to the N type, are returned to a P type. As a result of the first N channels disappearing, a path through which electrons flow from the N emitter layer 4 to the N base layer 2 disappears. Consequently, injection of electrons from the emitter electrode 14 to the N base layer 2 is stopped, forward bias of the PN junction of the P collector layer 5 and the N base layer 2 is cancelled, and injection of holes from the collector electrode 15 to the N base layer 2 through the P collector layer 5 is stopped. Conductivity modulation of the N base layer 2 is cancelled and resistance of the N base layer 2 returns to a state before the conductivity modulation occurs. The PN junction of the P base layer 3 and the N base layer 2 becomes a depletion layer and exhibits voltage block characteristics. As a result, a state transitions to an OFF state (voltage block) in which a current does not flow from the collector electrode 15 to the emitter electrode 14.

In the turn-off switching operation, a voltage $V_{G2C}$ which is positive with respect to the collector electrode 15 is applied to the back side gate electrodes 11 immediately before or at substantially the same time as application of a voltage which is positive with respect to the emitter electrode 14 to the front side gate electrodes 8 is stopped. As a result, the back side gate channels 17 are formed as a result of regions near the back side gate electrodes 11 being inverted to an N type. A current path constituted with the N base layer 2, the back side gate channels 17 and the N collector layer 6 is formed. As a result of electrons being discharged from the N base layer 2 to the collector electrode 15 through this path, density of electrons in the N base layer 2 starts to decrease. This decrease in the density of electrons weakens the forward bias of the PN junction of the P collector layer 5 and the N base layer 2 and decreases injection of holes from the P collector layer 5 to the N base layer 2. If the positive gate voltage $V_{G1E}$ applied to the front side gate electrodes 8 is switched to a zero volt or a reverse bias in this situation, the front side gate channels 16, which are inverted to the N type, are returned to a P type, and injection of electrons from the emitter electrode 14 is stopped. The electrons accumulated in the N base layer 2 are discharged to the collector electrode 15 through the back side gate channels 17 and the N collector layer 6. The holes accumulated in the N base layer 2 are discharged to the emitter electrode 14 through the P base layer 3. A depletion electric field occurring as a result of the PN junction of the P base layer 3 and the N base layer 2 becoming a depletion layer quickly discharges the electrons accumulated in the N base layer 2 to the collector electrode 15 and quickly discharges the holes to the emitter electrodes 14.

Immediately before application of a voltage which is positive with respect to the emitter electrode 14 to the front side gate electrodes 8 is stopped, a voltage $V_{G2C}$ which is positive with respect to the collector electrode 15 is applied to the back side gate electrodes 11. This decreases accumulation of electrons in the N base layer 2 and also decreases density of holes to satisfy charge neutral. Consequently, a time period from when an excess charge accumulated in the N base layer 2 disappears is shortened, and a loss of turn-off switching is further reduced.

Figure 8:
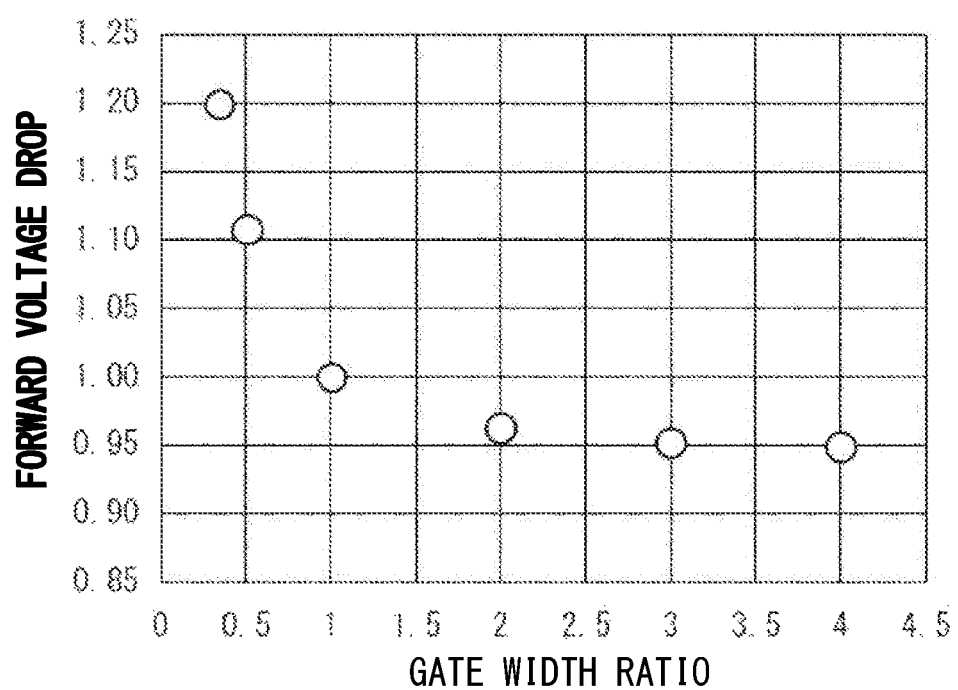
FIG. 8 is a view illustrating a simulation result of relationship between a gate width ratio of the IGBT having the double gate structure whose withstand voltage is on the order of 1 kV and forward voltage drop of a parasitic diode.

FIG. 8 is a view illustrating a simulation result of relationship between a gate width ratio of the IGBT having the double gate structure whose withstand voltage is on the order of 1 kV and forward voltage drop of a parasitic diode. FIG. 8 indicates the gate width ratio ($\Sigma G2W/\Sigma G1W$) on a horizontal axis. FIG. 8 indicates a relative value of the forward voltage drop @150 A/cm$^2$ of the parasitic diode on a vertical axis. A scaling design technology is applied to the front side gate structure. A distance from the P collector layer 5 to the P base layers 3, that is, a thickness of the N base layer 2 is set at 115 micrometers. The cell pitch CP is set at 12 micrometers. A depth of the front side trenches 7 is set at 2.5 micrometers. A gate rated voltage of the front side gate and the back side gate is set at ±7 V, and a threshold voltage is set at from 1.6 V to 1.8 V. 0 V is applied to the front side gate electrodes 8, and 5 V is applied to the back side gate electrodes 11. A temperature is 150° C. which is a typical rated temperature of the IGBT. A current which is to flow is converted into current density to eliminate factors depending on a size of the IGBT having the double gate structure.

It can be seen that if the gate width ratio ($\Sigma G2W/\Sigma G1W$) falls below 1.0, forward voltage drop of the parasitic diode largely increases beyond a level of an error, and energization capability as a diode degrades. Here, if the gate width ratio is small, a gate width G2W of the back side gate electrodes 11 which become a passage of a current becomes narrower and the back side gate channel 17 becomes narrower. This increases resistance of the back side gate channels 17 and precipitously increases the forward voltage drop of the parasitic diode.

Figure 9:
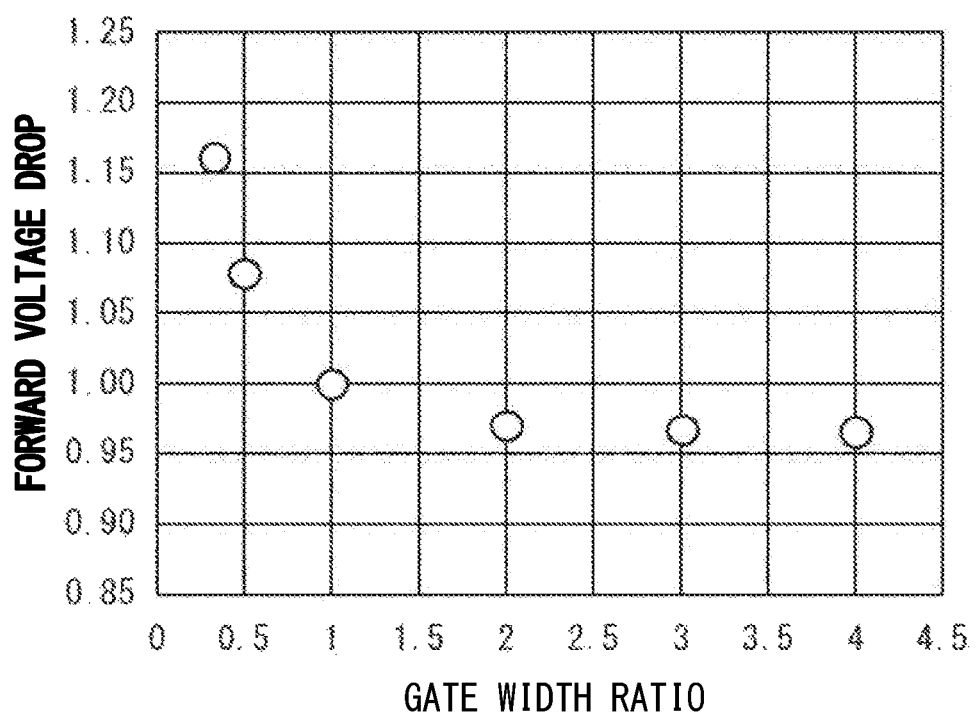
FIG. 9 is a view illustrating a simulation result of relationship between a gate width ratio of the IGBT having the double gate structure whose withstand voltage is on the order of 3 kV and forward voltage drop of the parasitic diode.

FIG. 9 is a view illustrating a simulation result of relationship between a gate width ratio of the IGBT having the double gate structure whose withstand voltage is on the order of 3 kV and forward voltage drop of the parasitic diode. FIG. 9 indicates the gate width ratio ($\Sigma G2W/\Sigma G1W$) on a horizontal axis. FIG. 9 indicates a relative value of the forward voltage drop @50 A/cm$^2$ of the parasitic diode on a vertical axis. A distance from the P collector layer 5 to the P base layer 3, that is, a thickness of the N base layer 2 is set at 350 micrometers. The cell pitch CP is set at 12 micrometers. A depth of the front side trenches 7 is set at 6 micrometers. Thicknesses of the front side gate insulating films 9 and the back side gate insulating films 12 are made thicker, a gate rated voltage of the front side gate and the back side gate is set at ±20 V, and a threshold voltage is set at from +5 V to +6 V. An applied voltage for driving is +15 V. 0 V is applied to the front side gate electrodes 8, and 15 V is applied to the back side gate electrodes 11. A temperature is 150° C. which is a typical rated temperature of the IGBT. A current which is to flow is converted into current density to eliminate factors depending on a size of the IGBT having the double gate structure.

It can be seen that if the gate width ratio ($\Sigma G2W/\Sigma G1W$) falls below 1.0, the forward voltage drop of the parasitic diode largely increases beyond a level of an error in a similar manner to the IGBT having the double gate structure on the order of 1 kV, and energization capability as a diode degrades. It was therefore confirmed that energization capability of the parasitic diode can be improved by setting the gate width ratio ($\Sigma G2W/\Sigma G1W$) at equal to or higher than 1.0 also at the IGBT having the double gate structure having different rating and characteristics.

As described above, the present embodiment is an IGBT having a double gate structure in which the back side gate electrodes 11 are provided to reduce a turn-off switching loss while maintaining a structure design in the emitter side IGBT region to achieve a low ON voltage of the IGBT. Then, the semiconductor device is designed so that the gate width ratio ($\Sigma G2W/\Sigma G1W$) becomes equal to or higher than 1.0 by adjusting the second gate total width $\Sigma G2W$ on the back side while making the first gate total width ΣG1W on the front side the same as that of the IGBT having the double gate structure in related art. This can improve energization capability of the parasitic diode in a reverse direction built in the IGBT.

Figure 10:
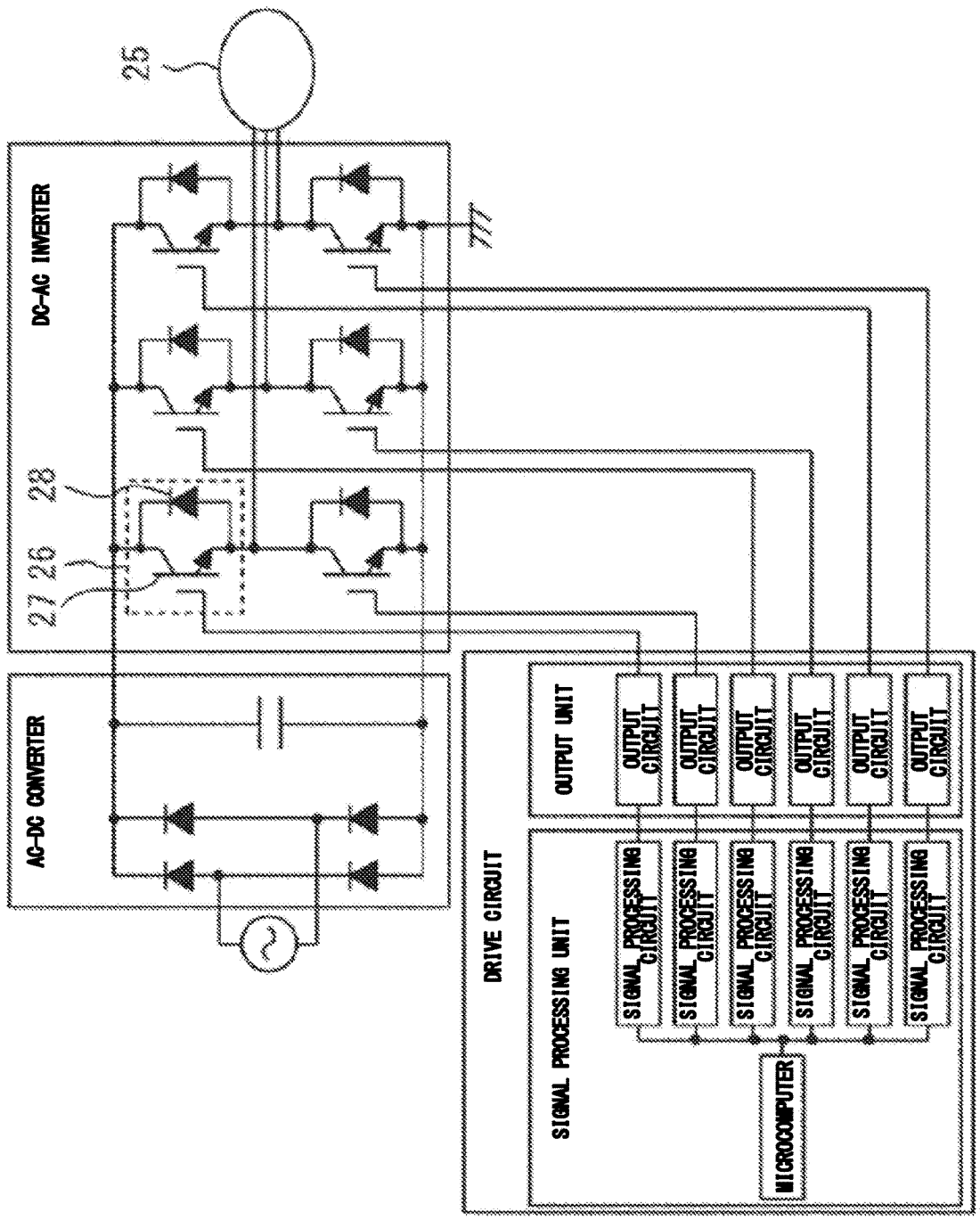
FIG. 10 is a view illustrating an inverter for motor control which is a typical example of load application of inductance (L).

FIG. 10 is a view illustrating an inverter for motor control which is a typical example of load application of inductance (L). Two IGBT units 26 are connected in series at each of three phases of a DC-AC inverter which drives a motor 25 to form an arm. Each IGBT unit 26 includes an IGBT 27 and a free wheeling diode (FWD) 28 connected in inverse parallel to the IGBT 27.

Drive power is supplied from a serial connection portion of the IGBT unit 26 to the motor 25. The IGBT 27 whose cathode is connected to the serial connection portion is called a P side (high side) IGBT. The IGBT 27 whose anode is connected to the serial connection portion is called an N side (low side) IGBT. The P side IGBT and the N side IGBT which are connected in series to constitute the arm are controlled so that the IGBTs are not put into an ON state (arm short-circuit) at the same time. The IGBT 27 which constitutes the arm supplies drive power to the motor by repeating ON/OFF while a time width of ON/OFF is adjusted and controlled. Energy is accumulated in an L load by a current flowing through the IGBT 27. When the IGBT 27 is turned off, the FWD causes a reverse current (which is a reverse current at the IGBT 27 but is a forward current at the FWD) to flow and consumes the energy.

The IGBT having the double gate structure according to the present embodiment is applied to the IGBT 27 of this inverter. At the IGBT having the double gate structure, the N base layer 2 can be electrically conducted to the collector electrode 15 by the back side gate being turned on, and electrical conduction between the N base layer 2 and the collector electrode 15 enables the PN junction constituted with the P base layer 3 and the N base layer 2 to function as a diode. By achieving electrical conduction between the N base layer 2 and the emitter electrode 14 by turning on the front side gate while turning on the back side gate, it is possible to cause a reverse current to flow while achieving electrical conduction between the emitter electrode 14 and the collector electrode 15. It is therefore also possible to provide the IGBT having the double gate structure with functions incorporating the FWD through control of the back side gate. Consequently, it is possible to make capacity of the free wheeling diode 28 smaller or eliminate the free wheeling diode 28. As a result, it is possible to achieve an inverter whose size is made drastically smaller.

Further, in the present embodiment, the back side gate electrodes 11 have a planar gate structure. Consequently, it is possible to omit a trench forming process, which makes manufacturing simple and improves productivity.

Figure 11:
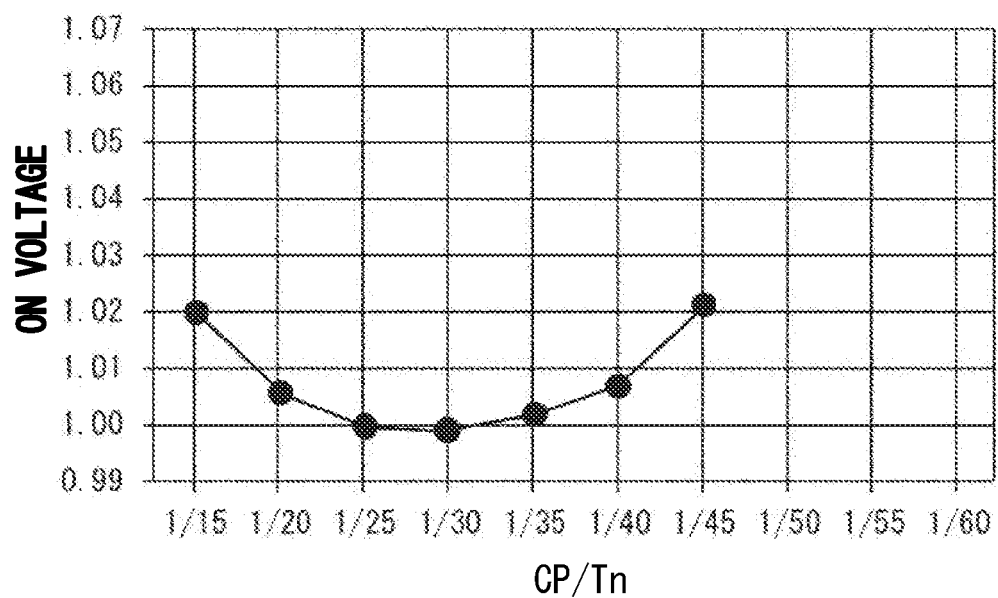
FIG. 11 is a view illustrating a simulation result of an ON voltage of the IGBT having the double gate structure, which has a trench gate structure on the front side and on the back side, and whose withstand voltage is on the order of 3 kV.

Further, in the scaling IGBT, there is optimal relationship between the thickness Tn of the N base layer 2 and the cell pitch CP. FIG. 11 is a view illustrating a simulation result of an ON voltage of the IGBT having the double gate structure, which has a trench gate structure on the front side and on the back side, and whose withstand voltage is on the order of 3 kV. FIG. 11 indicates a ratio CP/Tn of the cell pitch CP with respect to Tn on a horizontal axis. FIG. 11 indicates an ON voltage standardized while a minimum value is set at 1 on a vertical axis. The gate width ratio (ΣG2W/ΣG1W) is set at 1.0. A rated gate voltage of the front side gate and the back side gate is set at ±20 V, and a threshold voltage is set at from 5 V to 6 V. 15 V is applied to the front side gate electrodes 8, and 0 V is applied to the back side gate electrodes 11. A temperature is 150° C. which is a typical rated temperature of the IGBT. As a result of the simulation, it can be seen that change of the ON voltage is small in a region where CP/Tn is from 1/40 to 1/20 and falls within a level of an error+1.0%. Thus, in the present embodiment, the semiconductor device is designed so that CP/Tn falls within a range from 1/40 to 1/20. By specifying the cell pitch on the front side in accordance with the thickness of the N base layer 2 in this manner, it is possible to reduce an ON voltage of the IGBT.

Second Embodiment

Figure 12:
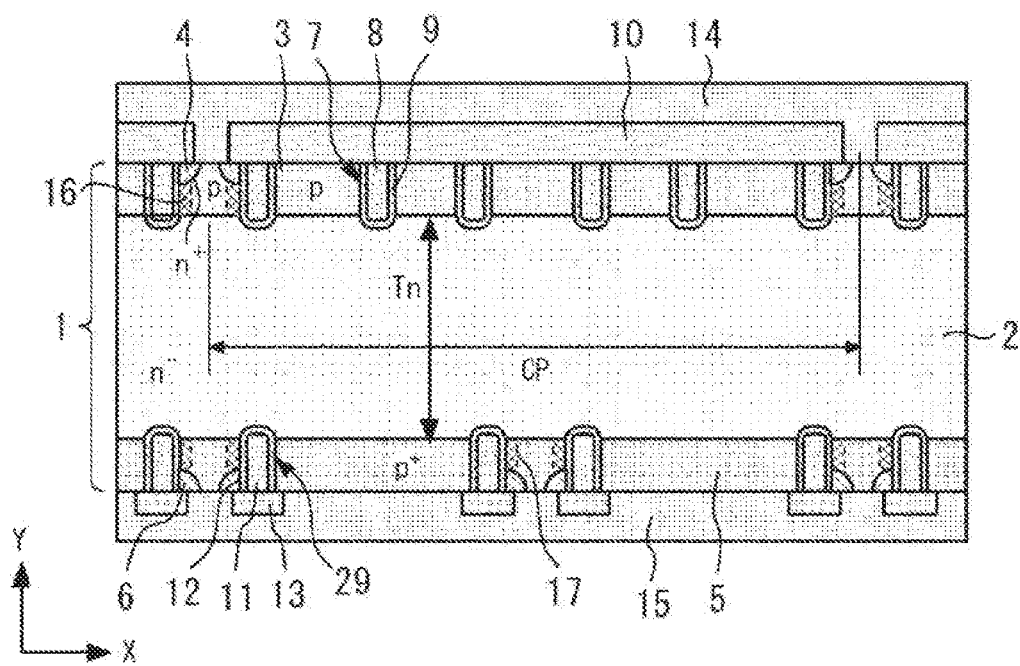
FIG. 12 is a cross-sectional view illustrating a semiconductor device according to a second embodiment.
Figure 13:
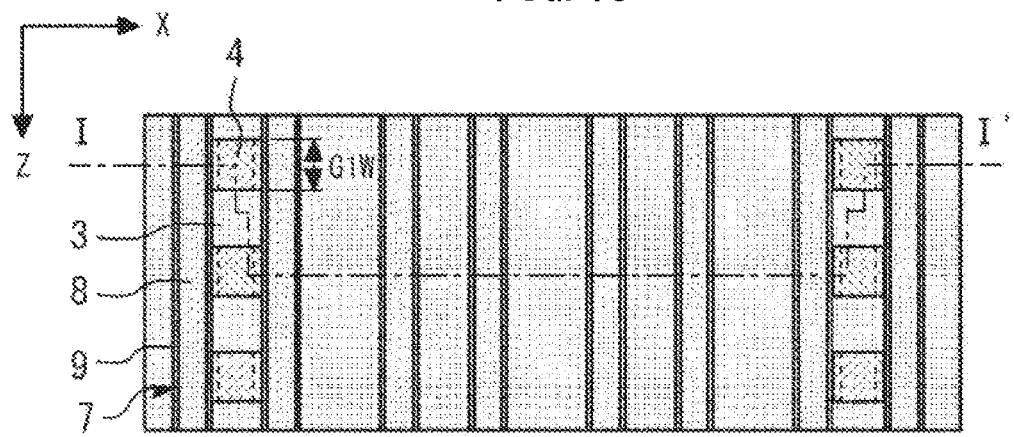
FIG. 13 is a plan view of part of the semiconductor device according to the second embodiment viewed from the emitter side.
Figure 14:
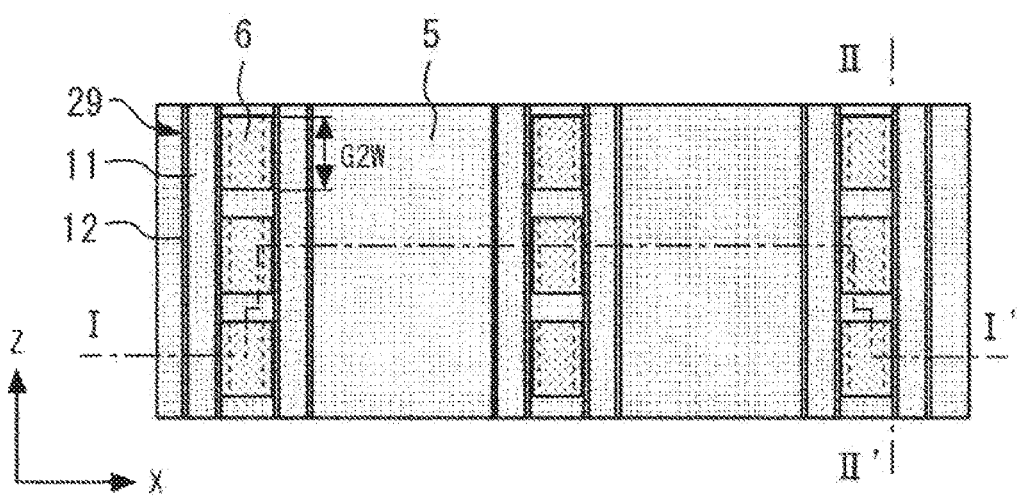
FIG. 14 is a plan view of part of the semiconductor device according to the second embodiment viewed from the collector side.
Figure 15:
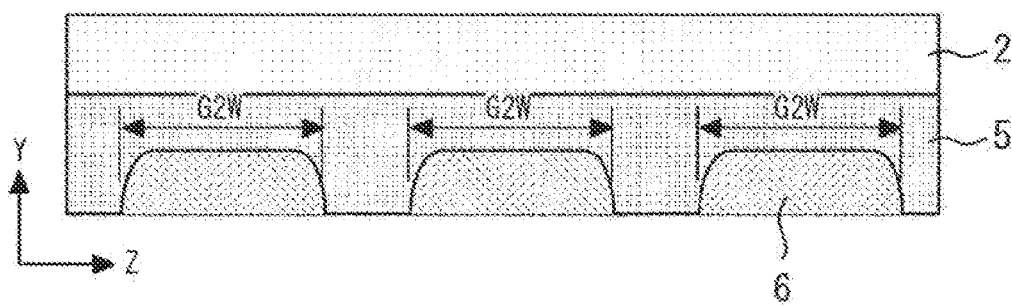
FIG. 15 is a cross-sectional view of a portion around the collector layer along II-II' in FIG. 14.

FIG. 12 is a cross-sectional view illustrating a semiconductor device according to a second embodiment. FIG. 13 is a plan view of part of the semiconductor device according to the second embodiment viewed from the emitter side. The emitter electrode 14 and the front side interlayer films 10 are omitted. FIG. 14 is a plan view of part of the semiconductor device according to the second embodiment viewed from the collector side. The collector electrode 15 and the back side interlayer films 13 are omitted. Note that FIG. 12 corresponds to a cross-sectional view along I-I' in FIG. 13 and FIG. 14. FIG. 15 is a cross-sectional view of a portion around the collector layer along II-II' in FIG. 14.

The present embodiment has a structure on the emitter side similar to that in the first embodiment and has a structure on the collector side different from that in the first embodiment. A plurality of trenches 29 are formed on the back side of the semiconductor substrate 1 so as to pass through the N collector layers 6 and the P collector layer 5 and reach the N base layer 2. The back side gate electrodes 11 are formed inside the plurality of trenches 29 via the back side gate insulating films 12. The back side interlayer films 13 cover the back side gate electrodes 11.

The back side gate electrodes 11 have a trench gate structure in this manner, so that it is possible to design a pitch of the back side gate electrodes 11 to be at approximately 6 micrometers. This enables the back side gate electrodes 11 to be arranged at higher density by designing an interval of the back side gate electrodes 11 to be narrower, than that of a planar gate structure having a pitch of approximately 12 micrometers.

Further, an electron injection enhancement effect is typically used to improve an ON voltage of the IGBT. Thus, the cell pitch of the front side gate electrodes 8 cannot be made smaller even using a trench structure. The trenches 7 do not have N emitter layers 4 and are provided with dummy cell portions which are not connected to the emitter electrode 14 to make the cell pitch larger because the trenches 7 are desired to be formed at equal intervals. Meanwhile, such a restriction is not imposed on the back side gate electrodes 11, and thus, the N collector layers 6 can be positioned at all mesa portions between the trenches 29.

Consequently, as a result of the back side gate electrodes 11 having the trench gate structure, it is possible to increase the second gate total width ΣG2W on the back side. Thus, the gate width ratio (ΣG2W/ΣG1W) can be easily made equal to or higher than 1.0. It is therefore possible to improve energization performance of the parasitic diode and decrease the forward voltage drop of the parasitic diode.

Third Embodiment

Figure 16:
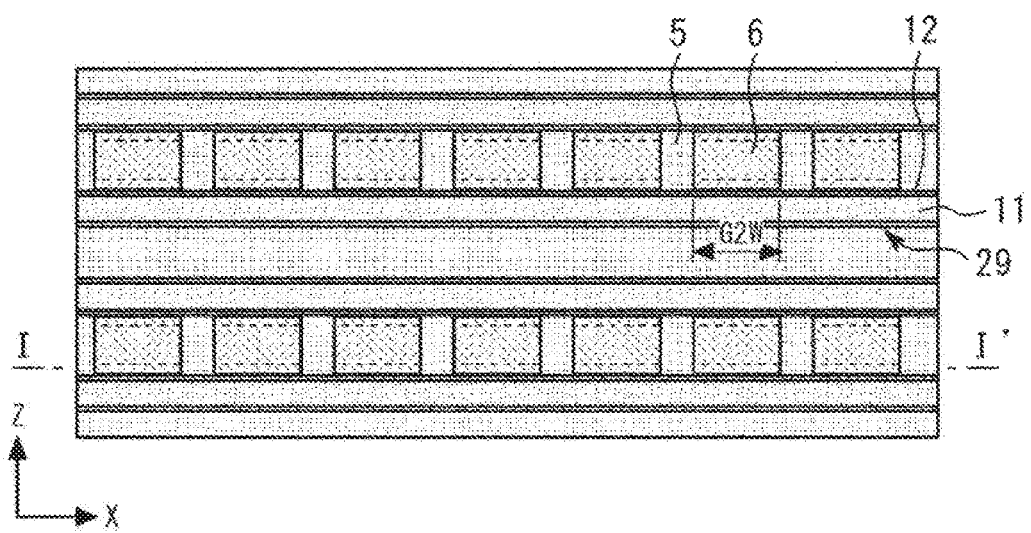
FIG. 16 is a plan view of part of a semiconductor device according to a third embodiment viewed from the collector side.
Figure 17:
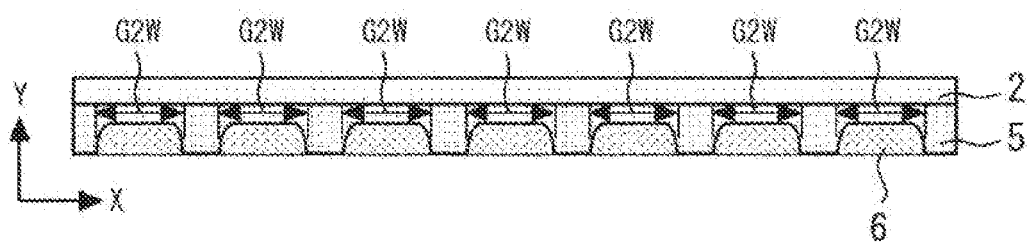
FIG. 17 is a cross-sectional view of a portion around the collector layer along I-I' in FIG. 16.

FIG. 16 is a plan view of part of a semiconductor device according to a third embodiment viewed from the collector side. The collector electrode 15 and the back side interlayer films 13 are omitted. FIG. 17 is a cross-sectional view of a portion around the collector layer along I-I' in FIG. 16. A structure on the emitter side of the present embodiment is similar to that in the first embodiment, and a longitudinal direction of the front side gate electrode 8 is a Z axis direction. Meanwhile, a longitudinal direction of the back side gate electrodes 11 is an X axis direction and different from the longitudinal direction of the front side gate electrodes 8.

Here, in a case where the front side gate electrodes 8 have a trench gate structure, a JFET resistance region does not exist in an electron injection path from the N emitter layer 4 to the N base layer 2. Electrons injected into the N base layer 2 increases by an amount corresponding to decrease in resistance in the electron injection path. This increases an amount of electrons accumulated in the N base layer 2 and makes the amount of electrons non-uniform. Further, as a result of a portion where the front side gate electrodes 8 which injects electrons overlap with the back side gate electrodes 11 which discharges electrons and a portion where the front side gate electrodes 8 do not overlap with the back side gate electrodes 11 locally occurring, non-uniform increase may occur in distribution of electrons in the N base layer 2 in transient operation of turn-off switching, which may converge currents and may bring destruction.

In contrast, in the present embodiment, a direction in which the back side gate electrodes 11 extend is made different from a direction in which the front side gate electrodes 8 extend. This prevents a portion into which electrons are likely to be injected from the front side gate electrodes 8 and accumulated from locally overlapping with a portion which is separate from the back side gate electrodes 11 and from which electrons are slowly discharged. It is therefore possible to improve uniformity of operation in transient operation such as switching. Further, the direction in which the back side gate electrodes 11 extend is preferably orthogonal to the direction in which the front side gate electrodes 8 extend. This makes in-plane variation of performance of the IGBT cell region further smaller.

Note that the semiconductor substrate 1 may be formed with a wide band gap semiconductor having a larger band gap than that of silicon, as well as being formed with silicon. The wide band gap semiconductor is, for example, silicon carbide, a gallium nitride-based material or diamond. A semiconductor device formed with such a wide band gap semiconductor has high withstand voltage characteristics and high allowable current density, so that the semiconductor device can be made smaller. Use of this semiconductor device which is made smaller can also make a semiconductor module which incorporates this semiconductor device smaller and more highly integrated. Further, the semiconductor device has high heat resistance, which can make a radiating fin of a heatsink smaller and can convert a water-cooling portion into an air-cooling portion, so that it is possible to make the semiconductor module further smaller. Further, the semiconductor device has a low power loss and has high efficiency, so that it is possible to increase efficiency of the semiconductor module.

Technical idea of the present disclosure is not limited to the above-described embodiment and can be changed to an IGBT having a double gate structure in which the front side gate structure is a planar gate structure, a Clustered IGBT (CIGBT) which exerts functions equivalent to the IGBT, or the like, within a range not deviating from the gist of the present disclosure.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-186056, filed on Nov. 6, 2020 including specification, claims, drawings and summary, on which the convention priority of the present application is based, is incorporated herein by reference in its entirety.

The invention claimed is:

1. A semiconductor device comprising:
   a semiconductor substrate having first and second main surface which face each other;
   a first semiconductor layer of a first conductive type provided between the first main surface and the second main surface of the semiconductor substrate;
   a second semiconductor layer of a second conductive type provided between the first semiconductor layer and the first main surface;
   a plurality of third semiconductor layers of a first conductive type selectively provided on a surface of the second semiconductor layer;
   a fourth semiconductor layer of a second conductive type provided between the first semiconductor layer and the second main surface;
   a plurality of fifth semiconductor layers of a first conductive type selectively provided on a surface of the fourth semiconductor layer;
   a first main electrode provided on the first main surface and connected to the second and third semiconductor layers;
   a second main electrode provided on the second main surface and connected to the fourth and fifth semiconductor layers;
   a plurality of first control electrodes respectively switching conductive states and non-conductive states between the first semiconductor layer and the plurality of third semiconductor layers in accordance with electrical signals; and
   a plurality of second control electrodes respectively switching conductive states and non-conductive states between the first semiconductor layer and the plurality of fifth semiconductor layers in accordance with electrical signals,
   wherein the plurality of first control electrodes have stripe shapes extending in a first direction in a planar view,
   the plurality of second control electrodes have stripe shapes extending in a second direction in a planar view,
   a sum of lengths in the first direction of boundaries between the second semiconductor layer and the plurality of third semiconductor layers on a surface of the semiconductor substrate which faces the plurality of first control electrodes is set as a first gate total width,
   a sum of lengths in the second direction of boundaries between the fourth semiconductor layer and the plurality of fifth semiconductor layers on a surface of the semiconductor substrate which faces the plurality of second control electrodes is set as a second gate total width, and
   a gate width ratio obtained by dividing the second gate total width by the first gate total width is equal to or higher than 1.0.

2. The semiconductor device according to claim 1, wherein the second control electrodes have a planar gate structure.

3. The semiconductor device according to claim 1, wherein the second control electrodes have a trench gate structure.

4. The semiconductor device according to claim 1, wherein the plurality of first control electrodes have a trench gate structure, a region on the first main surface side of the semiconductor substrate is divided into a plurality of mesa portions by trenches of the plurality of first control electrodes, the plurality of mesa portions include cell portions including the third semiconductor layer connected to the first main electrode and dummy cell portions which do not include the third semiconductor layer connected to the first main electrode or which do not include the third semiconductor layer, and an interval between adjacent cell portions is 1/40 to 1/20 of a shortest distance from the second semiconductor layer to the fourth semiconductor layer.

5. The semiconductor device according to claim 1, wherein the first control electrodes have a trench gate structure, and the second direction is different from the first direction.

6. The semiconductor device according to claim 5, wherein the second direction is orthogonal to the first direction.

7. The semiconductor device according to claim 1, wherein the semiconductor substrate is formed with a wide band gap semiconductor.

\* \* \* \* \*